US012349484B2

United States Patent
Jeong et al.

(10) Patent No.: US 12,349,484 B2
(45) Date of Patent: Jul. 1, 2025

(54) IMAGE SENSOR AND MANUFACTURING PROCESS THEREOF

(71) Applicant: SAMSUNG ELECTRONICS CO., LTD., Suwon-si (KR)

(72) Inventors: Hoemin Jeong, Suwon-si (KR); Seungjoo Nah, Gwangju (KR); Heegeun Jeong, Suwon-si (KR); Wonmo Chun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/754,448

(22) Filed: Jun. 26, 2024

(65) Prior Publication Data

US 2024/0347559 A1    Oct. 17, 2024

Related U.S. Application Data

(63) Continuation of application No. 17/453,013, filed on Nov. 1, 2021, now Pat. No. 12,087,785.

(30) Foreign Application Priority Data

Nov. 24, 2020    (KR) .................. 10-2020-0159232

(51) Int. Cl.
*H10F 39/00*    (2025.01)
*H10F 39/18*    (2025.01)

(52) U.S. Cl.
CPC ....... *H10F 39/8023* (2025.01); *H10F 39/024* (2025.01); *H10F 39/182* (2025.01); *H10F 39/8053* (2025.01); *H10F 39/8057* (2025.01); *H10F 39/8063* (2025.01); *H10F 39/807* (2025.01); *H10F 39/809* (2025.01)

(58) Field of Classification Search
None
See application file for complete search history.

(56) References Cited

U.S. PATENT DOCUMENTS 9,437,645 B1 *    9/2016   Chou .................... H10F 39/807
9,571,760 B2      2/2017   Kang et al.
(Continued)

FOREIGN PATENT DOCUMENTS

KR    10-2017-0071184 A    6/2017
KR    10-2019-0017197 A    2/2019
KR    10-2020-0099253 A    8/2020

*Primary Examiner* — Alexander G Ghyka
(74) *Attorney, Agent, or Firm* — MORGAN, LEWIS & BOCKIUS LLP

(57) ABSTRACT

An image sensor includes first through fourth pixels. The first pixel includes a first color filter, a first photoelectric conversion device (PD), and a first microlens. The second pixel includes a second PD and a first filling portion. The third pixel includes a third PD and a second filling portion. The fourth pixel includes a fourth PD, a second microlens, and a second color filter different from the first color filter. The second pixel is adjacent to the first pixel. The third pixel is adjacent to the second pixel. The second and third pixels do not comprise any one of a red, blue, and green color filter. Each of the first and second filling portions is configured to transmit light of wavelengths corresponding to blue, red, and green to the second and third PDs, respectively. The first color filter is configured to transmit light of the wavelength corresponding to blue.

20 Claims, 13 Drawing Sheets

(56) References Cited

U.S. PATENT DOCUMENTS

| | | |
|---|---|---|
| 9,620,541 B2 | 4/2017 | Ito |
| 9,780,139 B2 | 10/2017 | Tayanaka et al. |
| 9,786,714 B2 | 10/2017 | Tayanaka |
| 9,941,314 B2 | 4/2018 | Okuno et al. |
| 10,020,340 B2 | 7/2018 | Itahashi et al. |
| 10,270,996 B2 | 4/2019 | Lee |
| 10,312,280 B2 * | 6/2019 | Lee .................. G02B 5/1885 |
| 10,412,349 B2 | 9/2019 | Hwang et al. |
| 10,446,599 B2 | 10/2019 | Cho |
| 10,498,947 B2 | 12/2019 | Cheng et al. |
| 10,594,962 B2 | 3/2020 | Kang |
| 10,674,068 B2 | 6/2020 | Ouyang |
| 2011/0018080 A1 * | 1/2011 | Ootake ................ H10F 77/40 |
| | | 257/E31.127 |
| 2017/0170216 A1 | 6/2017 | Lee et al. |
| 2017/0170238 A1 * | 6/2017 | Lee .................. H10F 39/807 |
| 2017/0236858 A1 * | 8/2017 | Oh .................... H04N 25/778 |
| | | 257/292 |
| 2017/0257554 A1 | 9/2017 | Huang et al. |
| 2018/0026061 A1 | 1/2018 | Tsai et al. |
| 2018/0211986 A1 | 7/2018 | Lee et al. |
| 2019/0052823 A1 | 2/2019 | Jung et al. |
| 2019/0281226 A1 | 9/2019 | Wang et al. |
| 2019/0296069 A1 | 9/2019 | Yang |
| 2019/0319060 A1 | 10/2019 | Do |
| 2020/0045223 A1 | 2/2020 | Pang et al. |
| 2020/0169704 A1 | 5/2020 | Fujii |
| 2020/0258928 A1 | 8/2020 | Seo et al. |
| 2021/0120198 A1 * | 4/2021 | Kim .................... H04N 25/11 |
| 2021/0193720 A1 | 6/2021 | Seo et al. |
| 2021/0280623 A1 * | 9/2021 | Boettiger ............ H10F 39/8053 |
| 2022/0165766 A1 | 5/2022 | Jeong et al. |

* cited by examiner

IMAGE SENSOR AND MANUFACTURING PROCESS THEREOF

CROSS-REFERENCE TO RELATED APPLICATIONS

This application is a continuation application of U.S. patent application Ser. No. 17/453,013, filed on Nov. 1, 2021, which claims priority under 35 U.S.C. § 119 to Korean Patent Application No. 10-2020-0159232, filed on Nov. 24, 2020 in the Korean Intellectual Property Office, the disclosures of which are incorporated by reference herein in their entirety.

TECHNICAL FIELD

Embodiments of the present inventive concept relate to an image sensor, and more particularly to an image sensor having a phase detection pixel.

DISCUSSION OF THE RELATED ART

Image sensors may be used for capturing images and converting the images into electrical signals. Image sensors may be used not only in electronic devices for general consumers, such as digital cameras, mobile phone cameras, portable camcorders, and the like, but also in cameras installed in vehicles, security devices, robots, and the like. Such image sensors may include a pixel array, and each pixel included in the pixel array may include a photo-sensing device. Image sensors may be required to perform an autofocusing function to accurately capture images under various image capturing conditions.

SUMMARY

An embodiment of the present inventive concept provides an image sensor having a phase detection pixel capable of accurately detecting a phase difference under various image capturing conditions.

According to an embodiment of the present inventive concept, an image sensor includes: a substrate including a plurality of first pixels configured to generate image data and a plurality of second pixels configured to detect phase information of light incident to the plurality of pixels; a light blocking pattern disposed on the substrate and providing a plurality of spaces, the plurality of spaces including a plurality of first spaces respectively disposed on the first pixels and at least one second space disposed on the plurality of second pixels; a plurality of color filters respectively disposed in the plurality of first spaces; and a microlens layer including a plurality of first microlenses respectively disposed on the plurality of color filters, at least one filling portion disposed in the at least one second space, and at least one second microlens disposed on the at least one filling portion, wherein the plurality of first microlenses and the at least one second microlens are disposed at the same height as each other, and wherein the at least one filling portion and the at least one second microlens include an integrated structure without an interface between the at least one filling portion and the at least one second microlens.

According to an embodiment of the present inventive concept, an image sensor includes: a substrate including: first and second surfaces opposing each other; a plurality of first pixels configured to generate image data; and at least one pair of second pixels configured to detect phase information of light incident to the at least one pair of second pixels; a circuit and a wiring structure disposed on the first surface of the substrate; a light blocking pattern disposed on the second surface of the substrate and providing a plurality of first spaces respectively disposed on the plurality of first pixels, and at least one second space disposed on the at least one pair of second pixels; a plurality of color filters respectively disposed in the plurality of first spaces; and a microlens layer including a filling portion disposed in the at least one second space, and a plurality of microlenses respectively disposed on the filling portion and the plurality of color filters, wherein the filling portion and the plurality of microlenses are each formed of a same light-transmitting material as each other.

According to an embodiment of the present inventive concept, an image sensor includes: a substrate including first and second surfaces opposing each other and including a plurality of pixels, the plurality of pixels including a plurality of image sensing pixels at least one phase detection pixel, wherein each pixel includes a plurality of photoelectric conversion devices; a circuit and a wiring structure disposed on the first surface of the substrate; a light blocking pattern disposed on the second surface of the substrate and providing a plurality of first spaces respectively disposed on the image sensing pixels and at least one second space disposed on the at least one phase detection pixel; a plurality of color filters respectively disposed in the plurality of first spaces; and a microlens layer including: a plurality of microlenses respectively disposed on the plurality of first and second spaces; and at least one filling portion extending from the plurality of microlenses to the at least one second space, wherein the at least one filling portion and the plurality of microlenses are each formed of a same light-transmitting material.

BRIEF DESCRIPTION OF THE DRAWINGS

The above and other features of the present inventive concept will become more apparent by describing in detail embodiments thereof with reference to the accompanying drawings, in which.

Figure 1:
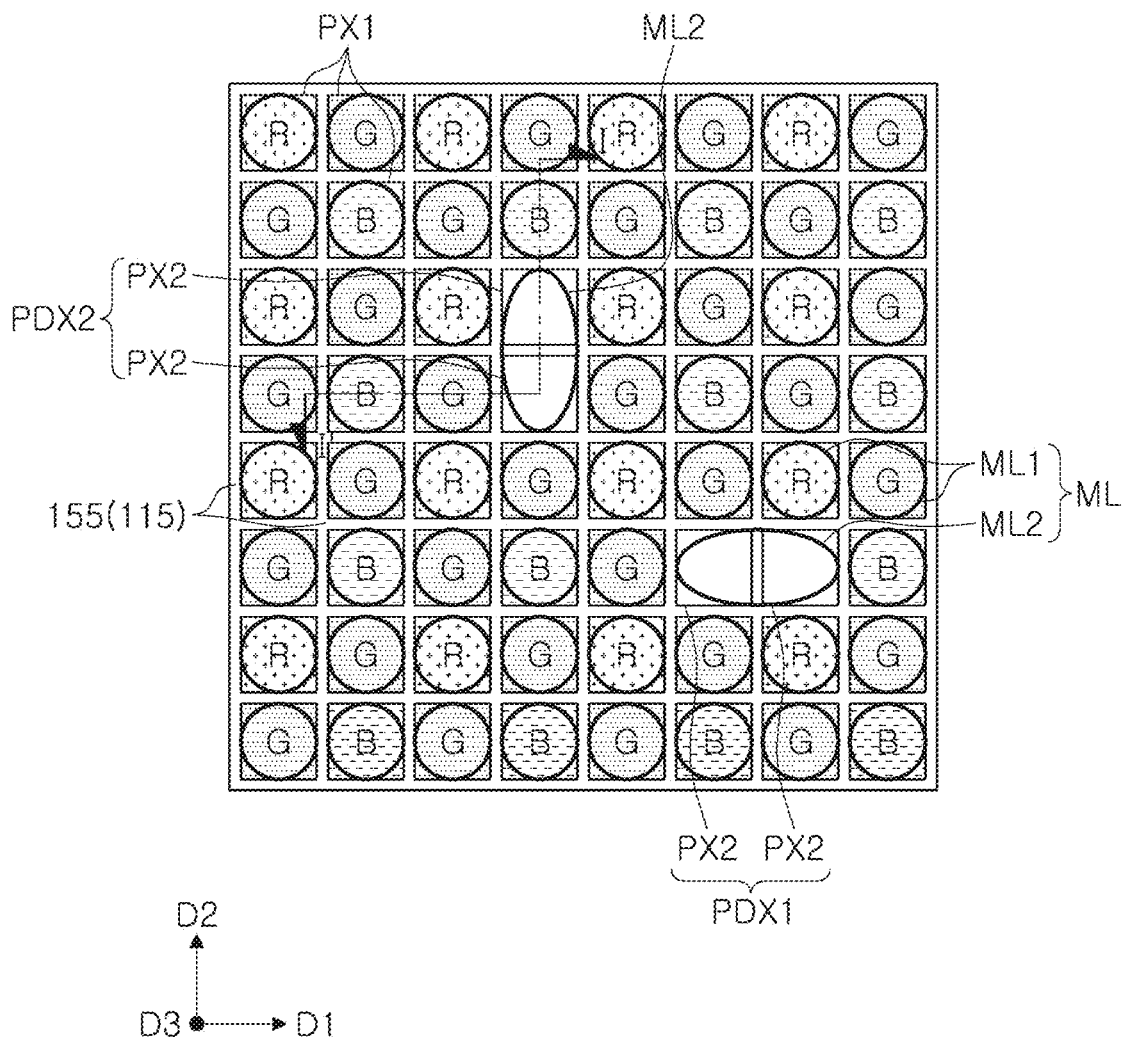
FIG. 1 is a plan view of an image sensor 100 according to an embodiment of the present inventive concept.

It should be noted that these figures are intended to illustrate the general characteristics of methods, structure, and/or materials utilized in certain embodiments and to supplement the written description provided below. These drawings are not, however, to scale and may not precisely reflect the structural or performance characteristics of any given embodiment, and should not be interpreted as defining or limiting the range of values or properties encompassed by embodiments of the inventive concept. For example, the relative thickness and positioning of molecules, layers, regions, and/or structural elements may be reduced or exaggerated for clarity. The use of similar or identical reference numbers in the various drawings is intended to indicate the presence of a similar or identical element or feature.

DETAILED DESCRIPTION

Embodiments of the present inventive concept will be described more fully hereinafter with reference to the accompanying drawings. Like reference numerals may refer to like elements throughout the accompanying drawings.

Figure 2:
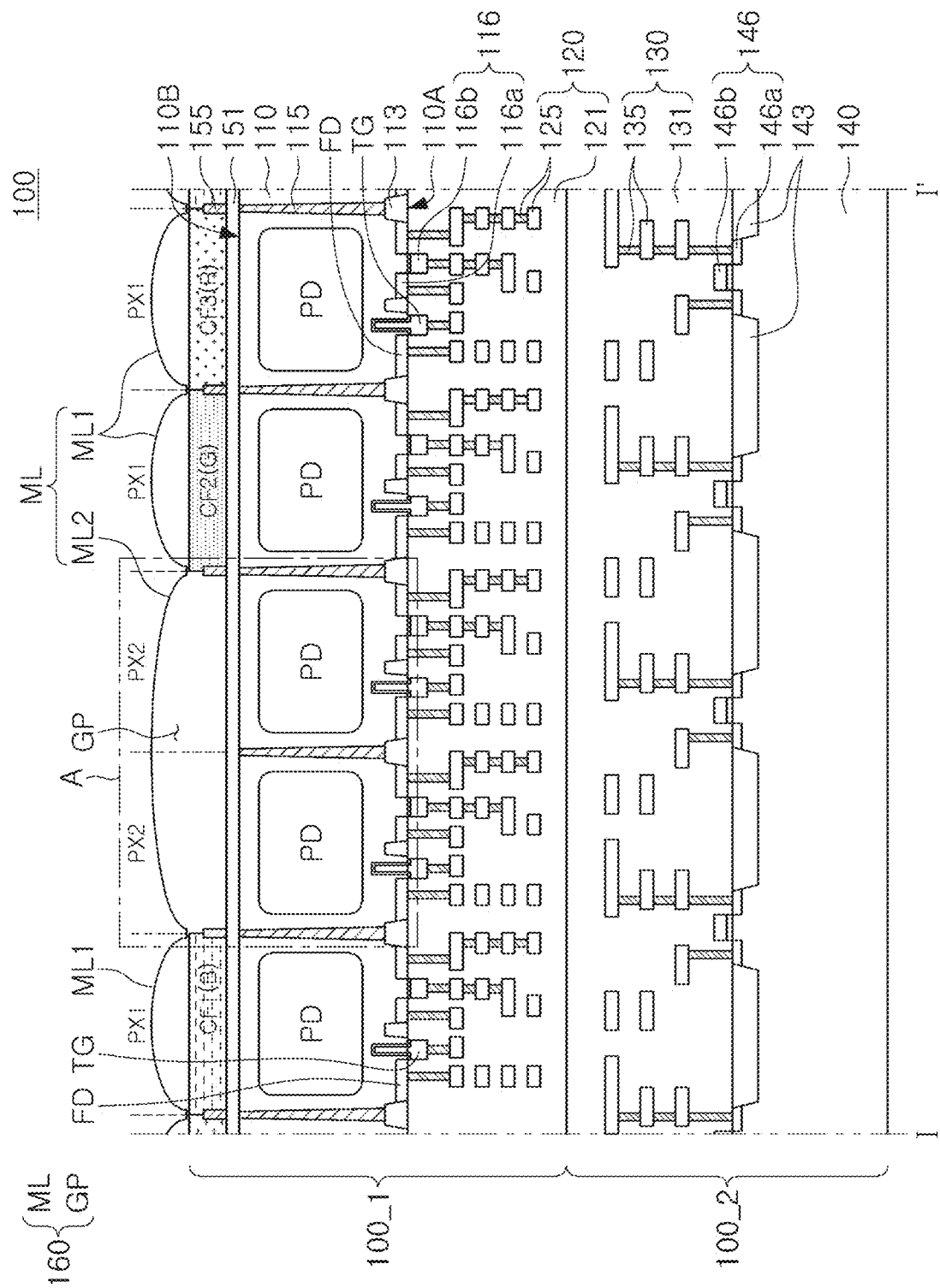
FIG. 2 is a cross-sectional view of the image sensor 100 taken along a line I-I' of FIG. 1.

FIG. 1 is a plan view of an image sensor 100 according to an embodiment of the present inventive concept, and FIG. 2 is a cross-sectional view of the image sensor 100 taken along a line I-I' of FIG. 1.

Referring to FIGS. 1 and 2, the image sensor 100 may include a second chip 100_2 and a first chip 100_1, which may be disposed on the second chip 100_2. The first chip 100_1 may include a first substrate 110. The first chip 100_1 may include a device isolation pattern 115 and a light blocking pattern 155 which may together provide a plurality of first pixels PX1 and a plurality of second pixels PX2 arranged along a plurality of rows and a plurality of columns. The first chip 100_1 may be an image sensor chip.

Each first pixel PX1 may be configured to generate image data, and each second pixel PX2 may be configured to detect phase information. The first pixels PX1 may be referred to as "image sensing pixels". For example, the first pixels PX1 may measure a distance between an object and the image sensor 100. The second pixels PX2 may be referred to as "phase detection pixels". For example, the second pixels PX2 may autofocus the image device 100. In an embodiment, each first pixel PX1 may have a width in a first direction DR1 and a length in a second direction DR2 orthogonal to the first direction DR1, and each second pixel PX2 may have the same width and length as each first pixel PX1.

In an embodiment, the first substrate 110 may include a first phase detection assembly PDX1 and a second phase detection assembly PDX2. The first phase detection assembly PDX1 may include a first pair of adjacent second pixels PX2 arranged in the first direction DI, and the second phase detection assembly may include a second pair of adjacent second pixels PX2 arranged in the second direction DR2. Each of the first and second pairs of the second pixels P2 may autofocus the image sensor 100.

In an embodiment, the first substrate 110 may include a plurality of microlenses ML, including first microlenses ML1 and second microlenses ML2. Each microlens ML1 may at least partially cover a first pixel PX1, and each microlens ML2 may at least partially cover a pair of adjacent second pixels PX2.

Referring to FIG. 2, the second chip 100_2 may include a second substrate 140. For example, the second substrate 140 may include a group IV semiconductor such as silicon (Si) or germanium (Ge), a group IV-IV compound semiconductor such as SiGe or SiC, or a group III-V compound semiconductor such as GaAs, InAs, or InP. A second wiring structure 130 may be disposed on the second substrate 140. The second substrate 140 may include a second device isolation unit 143 which may provide a second active region. A plurality of second transistors 146 may be formed on the second active region. The second transistors 146 may have, for example, impurity regions 146a, which may act as a source or a drain, and gates 146b. The plurality of second transistors 146 may form a logic circuit for processing an image. The second wiring structure 130 may include a second insulating layer 131. A second multilayer wiring 135 may be formed in the second insulating layer 131 and may be connected to the second transistors 146. The second multilayer wiring 135 may include a plurality of wiring layers spaced apart from each other, and vias which may electrically connect the plurality of wiring layers and/or the second transistors 146.

The first substrate 110 may have a first surface 110A and a second surface 110B opposing each other. A first wiring structure 120 may be disposed on the first surface 110A. The device isolation pattern 115 may be disposed in the first substrate 110. The device isolation pattern 115 may provide the pixels PX1 and PX2. For example, each of the first and second pixels PX1 and PX2 may be at least partially surrounded by the device isolation pattern 115. In an embodiment, the device isolation pattern 115 may extend from the first surface 110A into the second surface 110B. However, the inventive concept is not limited thereto. For example, in an embodiment, the device isolation pattern may be spaced apart from the second surface 110B.

A photoelectric conversion device PD may be disposed in each first and second pixel PX1 and PX2. For example, each photoelectric conversion device PD may generate and accumulate electric charges in proportion to an amount of light incident on the second surface 110B of the first substrate 110. For example, each photoelectric conversion device PD may be implemented as a photo diode, a photo transistor, a photo gate, a pinned photo diode (PPD), or a combination thereof.

A first device isolation unit 113 may be disposed on the first surface 110A and may provide a first active region. A plurality of transfer gates TG and floating diffusion regions FD may be disposed on the active region, and a plurality of first transistors 116 may be formed on the active region. A transfer gate TG may have a vertical transistor gate structure extending from a surface of the active region e.g., from the first surface 110A, into the first substrate 110. Each floating diffusion region FD may be formed in a portion of the active region adjacent to a transfer gate TG. The first transistors 116 may have, for example, impurity regions 116a, which may act as a source or a drain, and gates 116b. Each first transistor 116 may be a reset transistor, a selection transistor, or a source follower transistor. The first wiring structure 120 may include a first insulating layer 121. The first insulating layer 121 may include, for example, a silicon oxide film or a silicon nitride film. A first multilayer wiring 125 may be formed in the first insulating layer 121 and may be connected to the first transistors 116. The first multilayer wiring 125 may include a plurality of wiring layers spaced apart from each other, and vias which may electrically connecting the plurality of wiring layers and/or the first transistors 116. The first multilayer wiring 125 may include, for example, a metal material (e.g. copper or tungsten).

According to an embodiment, the image sensor 100 may include an insulating film 151, color filters CF1, CF2, and CF3, and a microlens layer 160, which may be sequentially disposed on the second surface 110B. The insulating film 151 may be formed between the second surface 110B and the color filters CF1, CF2, and CF3 and may at least partially cover the second surface 110B. The insulating film 151 may include an antireflection layer. In some embodiments, the insulating film 151 may additionally include a planarization layer. For example, the insulating film 151 may include at least one layer, and each layer may include aluminum oxide, hafnium oxide, silicon oxide, and/or silicon nitride.

The light blocking pattern 155 may be disposed on the insulating film 151. The light blocking pattern 155 may provide a plurality of first spaces for arranging the color filters CF1, CF2, and CF3 in the first pixels PX1. A color filter CF1, CF2, or CF3 may be disposed on the insulating film 151 in a first space of the light blocking pattern 155. In an embodiment, a color filter CF1, CF2, or CF3 may vertically overlap a photoelectric conversion device PD. The color filters CF1, CF2, and CF3 may include a blue (B) color filter CF1, a green (G) color filter CF2, and a red (R) color filter CF3, each of which may transmit light of a specific wavelength corresponding to their respective colors to a photoelectric conversion device PD disposed beneath. The color filters CF1, CF2, and CF3 may be arranged in a Bayer-type pattern, as illustrated in FIG. 1. For example, the color filters may be arranged such that the number of green (G) color filters CF2 may be half of the number of all color filters, as the human eye may be most sensitive to green light.

In addition, the light blocking pattern 155 may provide a plurality of second spaces, each corresponding to the first or second phase detection assemblies PDX1 and PDX2. The light blocking pattern 155 may at least partially cover the insulating film 151. The light blocking pattern 155 might not cover the photoelectric conversion devices PD in the first and second pixels PX1 and PX2. In an embodiment, the light blocking pattern 155 may include a metal such as tungsten.

The microlens layer 160 may be disposed above the light blocking pattern 155 and may include the mircrolenses ML and a plurality of filling portions GP. Each filling portion GP may be disposed in a second space of the light blocking pattern 155. The microlens layer 160 may be formed of a light-transmitting material. For example, the microlens layer 160 may include a transparent material having light transmittance of 90% or more for light within the entire visible light band. For example, the microlens layer 160 may include a transparent resin.

The microlenses ML may each have a convex shape (e.g., hemispherical shape) in an upward direction and may each have a predetermined radius of curvature. The microlenses ML may each concentrate light that may be incident on the image sensor 100. The first microlenses ML1 may be disposed on the color filters CF1, CF2, and CF3, and the second microlenses ML2 may be disposed at the same height as the first microlenses ML1.

In an embodiment, the filling portions GP may be integrated with the microlenses ML. The filling portions GP and the microlenses ML may be formed by the same process (see FIGS. 4D and 4E). The filling portions GP may be disposed on a lower surface of the second microlenses ML2. The filling portions GP may be formed to be continuous with the second microlenses ML2. In other words, there might not be an interface between the filling portions GP and the second microlenses ML2. For example, the filling portions GP may be formed of the same light-transmitting material as the microlens layer 160. The filling portions GP may be provided to transmit incident light that might not be transmitted by the color filters CF1, CF2, and CF3. In addition, as the filling portion GP may be continuous with the second microlenses ML2, the filling portions GP might not reflect light transmitted by the second microlenses ML2, which may greatly improve a light-receiving capability of the photoelectric conversion devices PD disposed in the second pixels PX2. Additionally, light loss due to reflection from an interface between a color filter CF1, CF2, or CF3 and a second microlens ML2 may be prevented.

Figure 3:
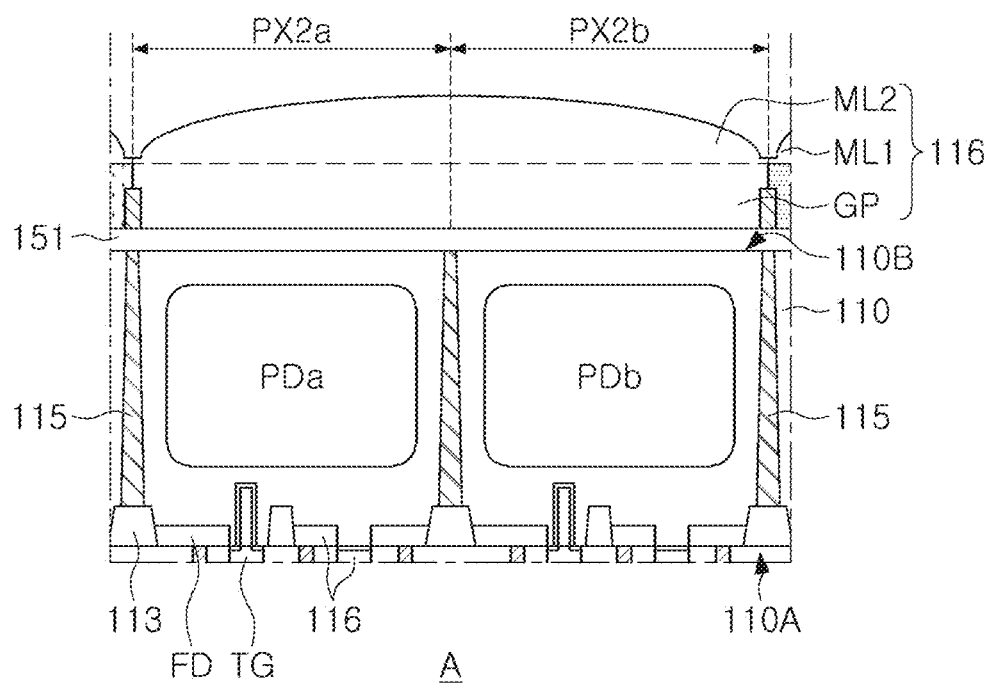
FIG. 3 is an enlarged cross-sectional view of an area A of FIG. 2.

FIG. 3 is an enlarged cross-sectional view of an area A of FIG. 2. As illustrated in FIG. 3, in an embodiment, a phase detection assembly PDX may include a second microlens ML2 disposed in a pair of adjacent second pixels PX2a and PX2b. The second microlens ML2 may control light incident on photoelectric conversion devices PDa and PDb via a shape and/or a refractive index of the microlens ML2. The second pixels PX2a and PX2b may receive light transmitted through the microlens ML2, may output phase signals corresponding to phase differences in the received light, and may autofocus the image sensor 100 based on the phase signals. For example, the photoelectric conversion devices PDa and PDb may receive different amounts of light from each other, depending on an incident direction of the light. In this manner, the phase detection assembly PDX may autofocus the image sensor 100 based on the difference in amount of light received by the photoelectric conversion devices PDa and PDb, and a corresponding phase difference.

A first pair of adjacent second pixels PX2a and PX2b included in the first phase detection assembly PDX1 may be arranged in a row direction and may autofocus the image sensor 100 based on a phase difference in the first direction, and a second pair of adjacent second phase detection pixels PX2a and PX2b included in the second phase direction assembly PDX2 may be arranged in a column direction and may autofocus the image sensor 100 based on a phase difference in the second direction.

FIGS. 4A to 4E are cross-sectional views of an image sensor 100 during a manufacturing process according to an embodiment of the present inventive concept.

Figure 4A:
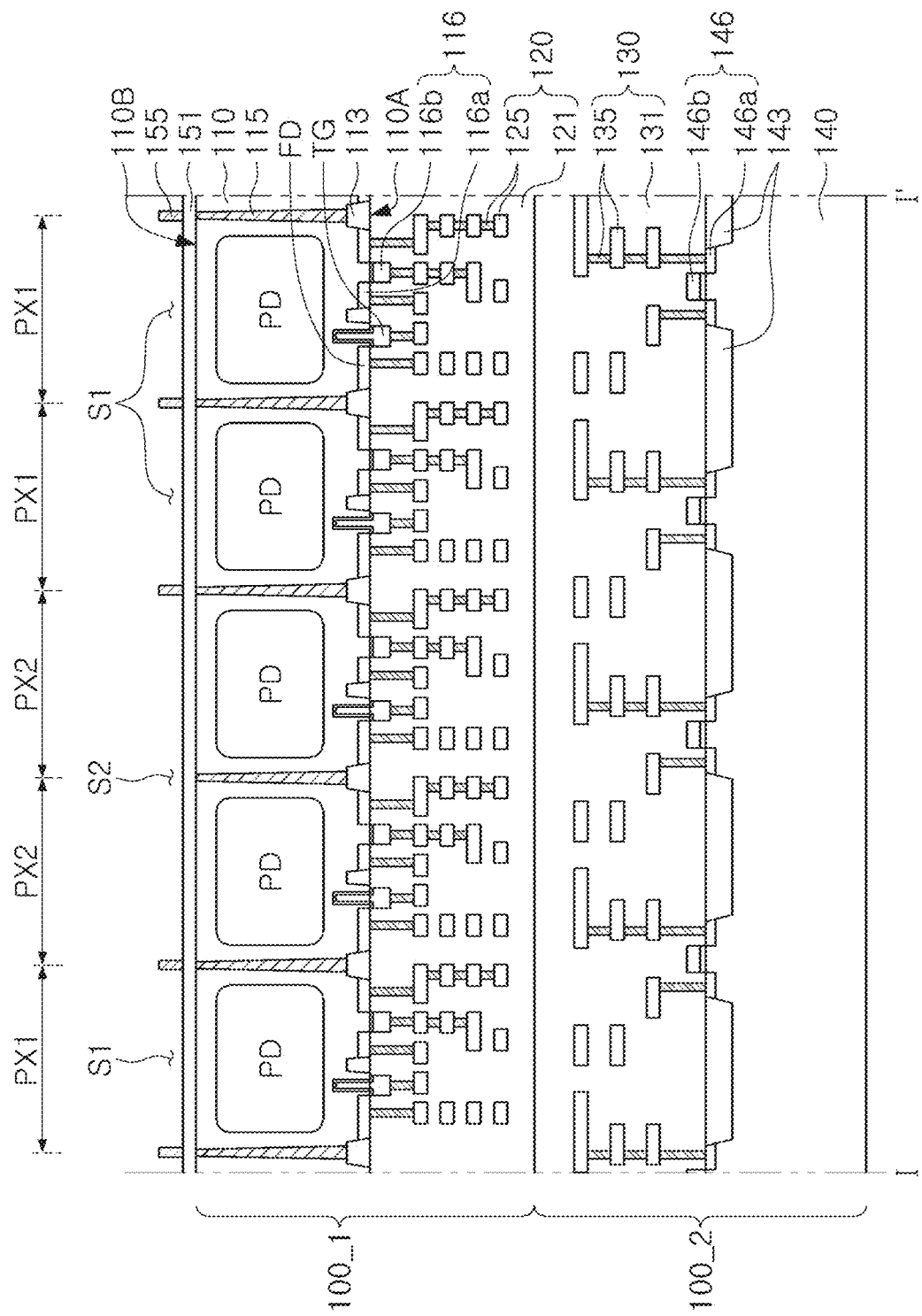
FIGS. 4A to 4E are cross-sectional views of an image sensor 100 during a manufacturing process according to an embodiment of the present inventive concept.

Referring to FIG. 4A, a first wafer may be bonded for a first chip 100_1 and a second wafer may be bonded for a second chip 100_2. Then, an insulating film 151 and a light blocking pattern 155 may be formed on a second surface 110B of a first substrate 110.

In an embodiment, this bonding process may be implemented as a wafer level process. For example, the first substrate 110 and a second substrate 140 may each be understood as a wafer. Photoelectric conversion devices PF may be formed by doping the first substrate 110 (i.e. the first wafer) with impurities of a first conductivity type and implanting the first substrate 110 with impurities of a second conductivity type. A first device isolation unit 113 may be formed on a first surface 110A of the first substrate 110, and a device isolation pattern 115 may be formed in the first device isolation unit 113 to a predetermined depth, to provide pixels PX1 and PX2. For example, the device isolation pattern 115 may include polysilicon. A plurality of floating diffusion regions FD, a plurality of transfer gates TG, and a plurality of first transistors 116 may be formed on the first surface 110A. The first wafer may be prepared for the first chip 100_1 by forming a first wiring structure 120 on the first surface 110A. The prepared first wafer may be bonded onto the second substrate 140 (i.e. the second wafer) for a second chip 100_2, which may provide a logic circuit.

The first substrate 110 may be thinned by grinding the first surface 110A. The device isolation pattern 115 may be exposed from the first surface 110A. The insulating film 151 may include an antireflection layer and/or a planarization layer. For example, the insulating film 151 may include at least one layer, and each layer may include aluminum oxide, hafnium oxide, silicon oxide, and/or silicon nitride.

A plurality of first and second pixels PX1 and PX2 may be provided by forming the light blocking pattern 155 on the insulating film 151. For example, the light blocking pattern 155 may include a metal such as tungsten. The light blocking pattern 155 may provide first spaces S1 for arranging color filters CF1, CF2, and CF3 and may provide a second space S2 corresponding to a space disposed at least partially above a pair of adjacent second pixels PX2.

Figure 4B:
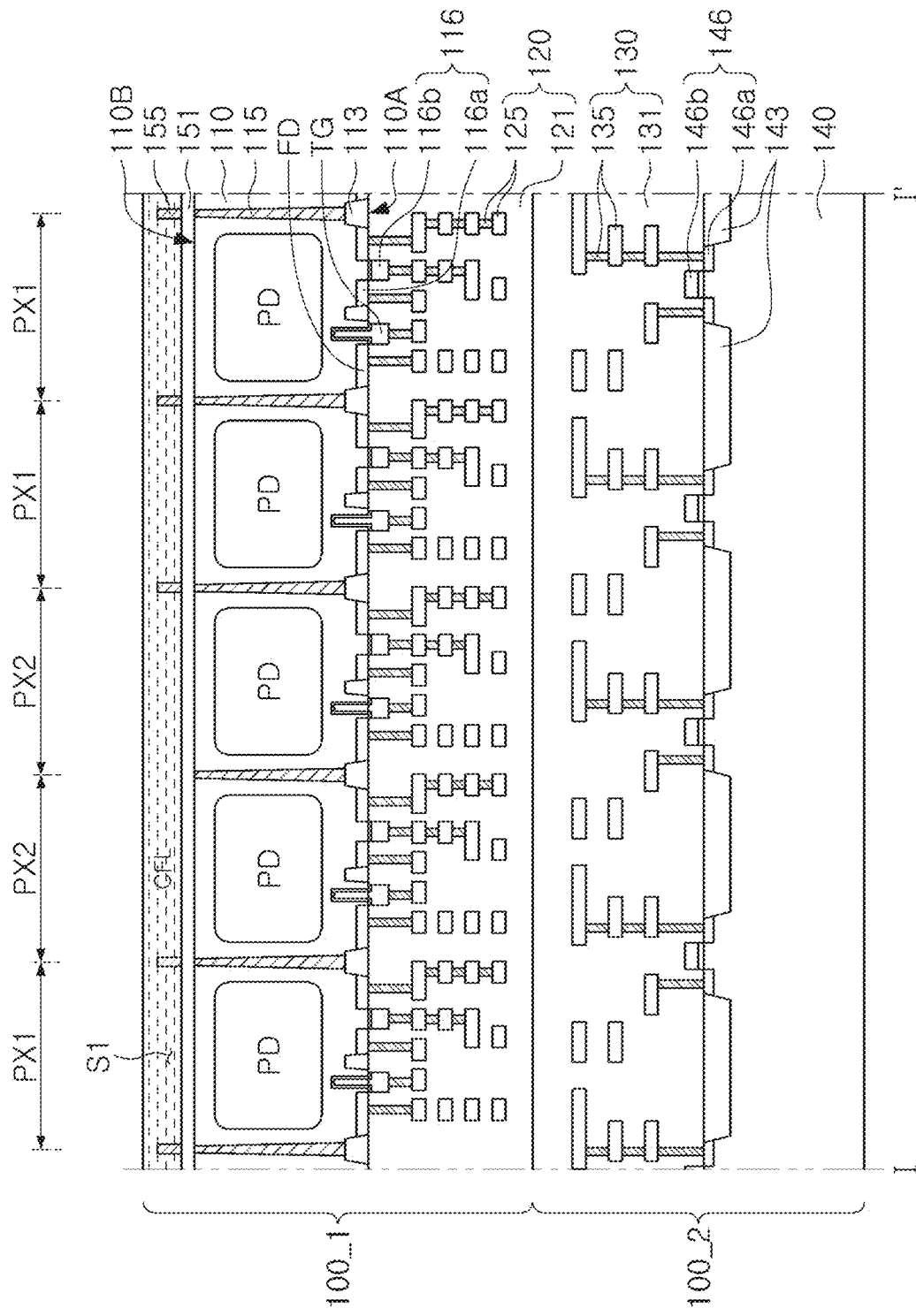

Next, referring to FIG. 4B, a color filter layer CFL may be formed in open first and second spaces S1 and S2. The color filter layer CFL may be formed by a coating process such as spin coating. The color filter layer CFL may include a filter material which may transmit light of a first wavelength (e.g., blue light). For example, such a filter material may be a resin layer having a dye or a pigment having a color filter function.

Figure 4C:
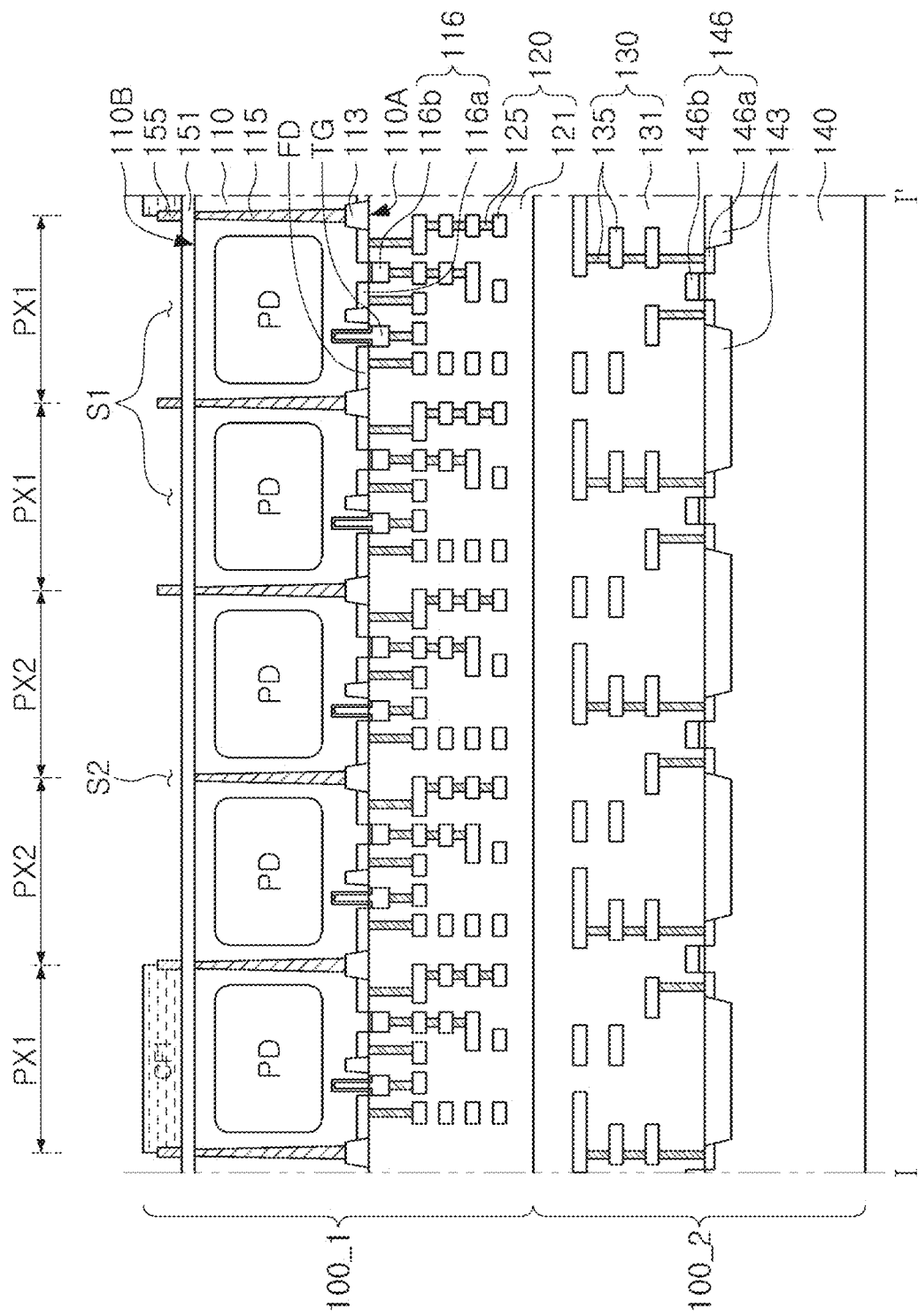

Next, referring to FIG. 4C, a first color filter CF1 may be formed in a selected first space S1 by patterning the color filter layer CFL. The patterning may be performed by exposure and development techniques. Such patterning may remove portions of the color filter layer CFL disposed above the second space S2 and first spaces S1 other than the selected first space S1.

Figure 4D:
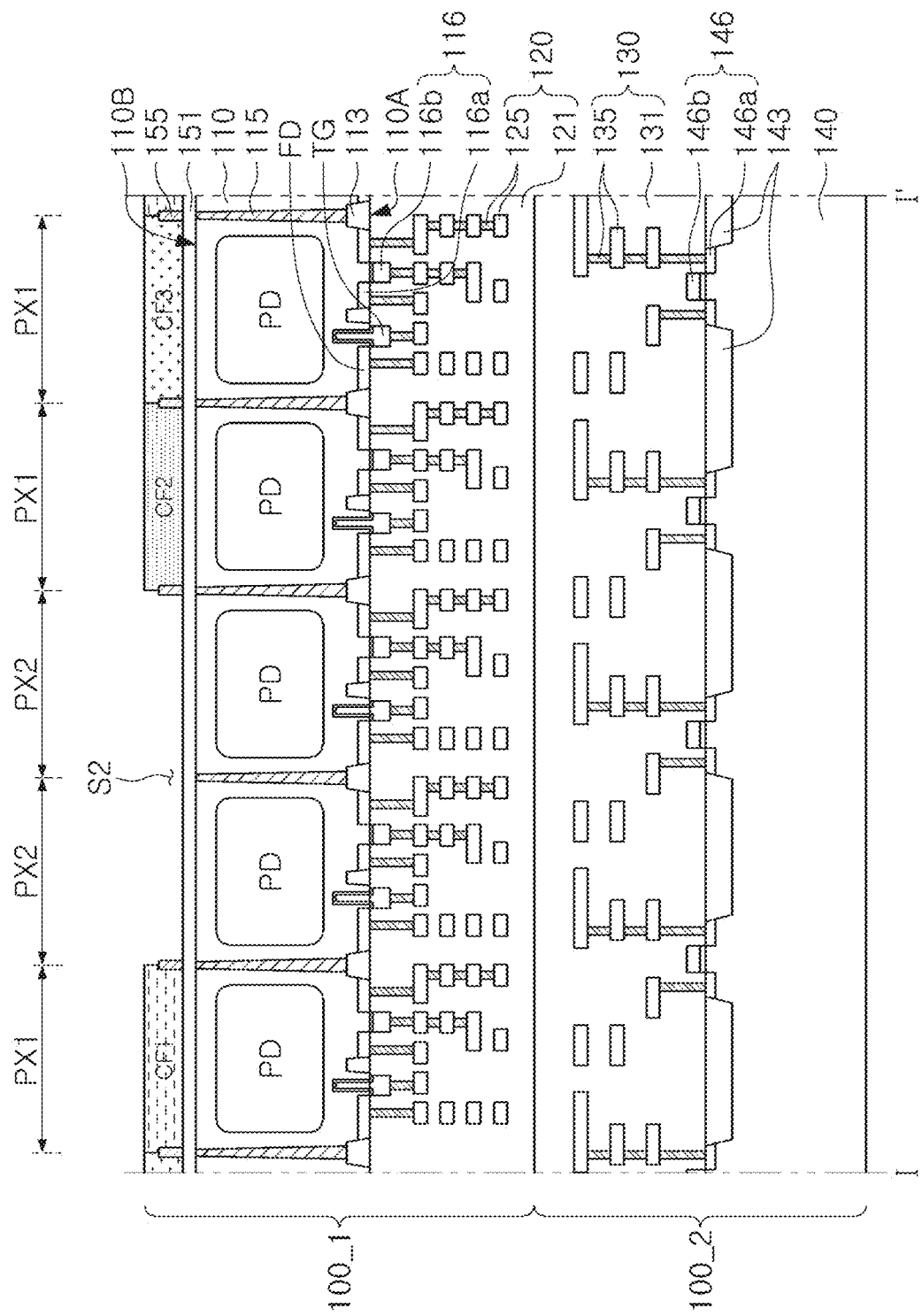

Next, referring to FIG. 4D, the processes illustrated by FIGS. 4B and 4C may be successively repeated to form a second color filter CF2 and a third color filter CF3, which may transmit light of a second wavelength (e.g., green light) and a third wavelength (e.g., red light), respectively, in selected first spaces S1.

Figure 4E:
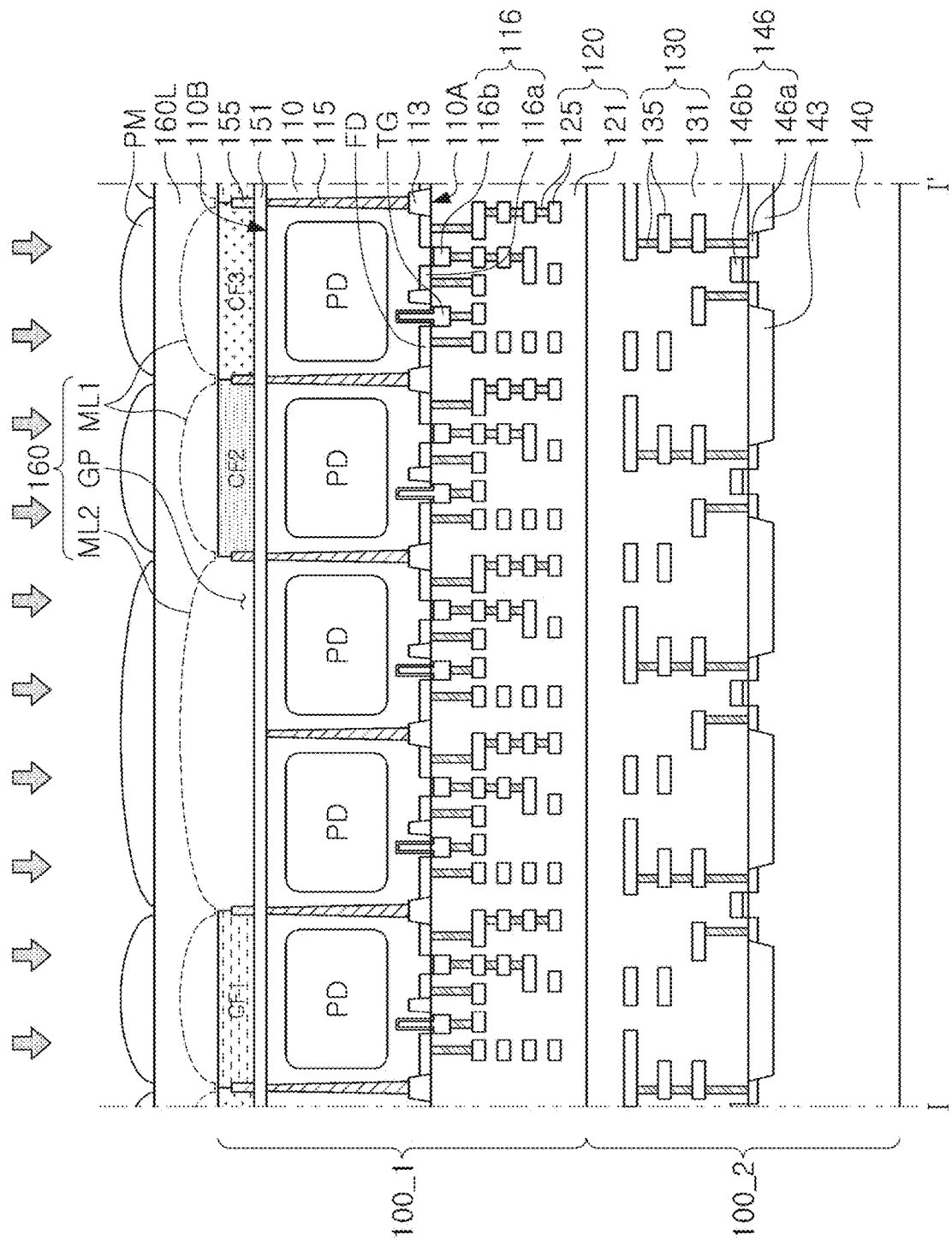

Next, referring to FIG. 4E, a microlens layer 160 may be formed on the first to third color filters CF1, CF2, and CF3 and in the second space S2. For example, the microlens layer 160 may be formed by a spin coating process. For example, the microlens layer 160 may include a transparent resin having excellent light transmittance. The microlens layer 160 may fill the second space S2 with a filling portion GP. The microlens layer 160 may be in contact with a portion of the insulating film 151 through the filling portion GP. The microlens layer 160 may be formed to have an upper surface having a substantially planar shape.

Sacrificial patterns PM corresponding to desired shapes of first microlenses ML1 and a second microlens ML2 may be formed on the microlens layer 160. In an embodiment, the desired shape of the second microlens ML2 may be an elongated shape across a pair of adjacent second pixels PX2. The sacrificial patterns PM may be formed by patterning a sacrificial material layer, and the sacrificial patterns PM may be reflowed to the desired shapes. Subsequently, the desired shapes may be transferred to the microlens layer 160 by etching the microlens layer 160 together with the sacrificial material layer. The etching may be performed until the sacrificial material layer is removed and the microlenses ML indicated by the dotted line are formed.

Figure 5:
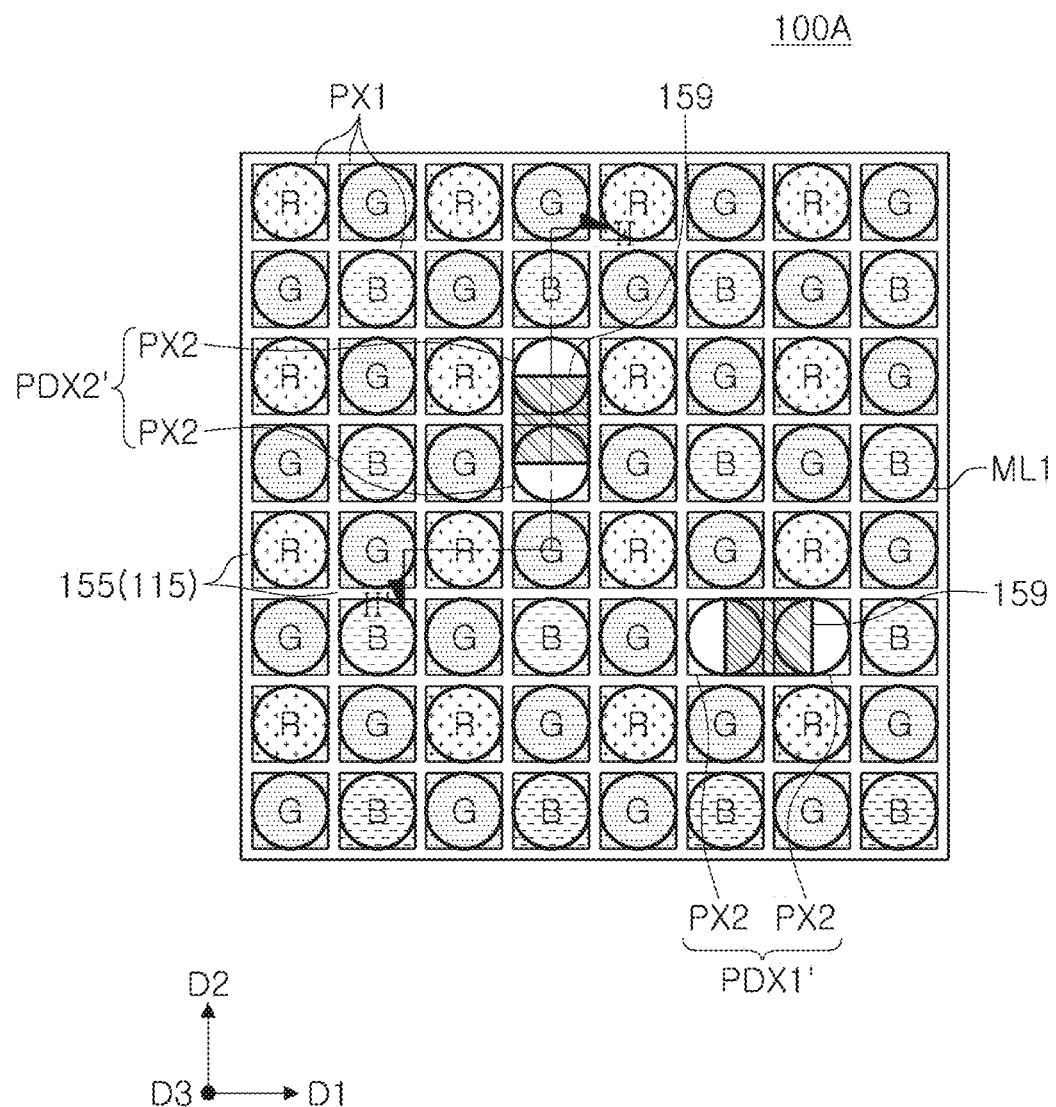
FIG. 5 is a plan view of an image sensor 100A according to an embodiment of the present inventive concept.
Figure 6:
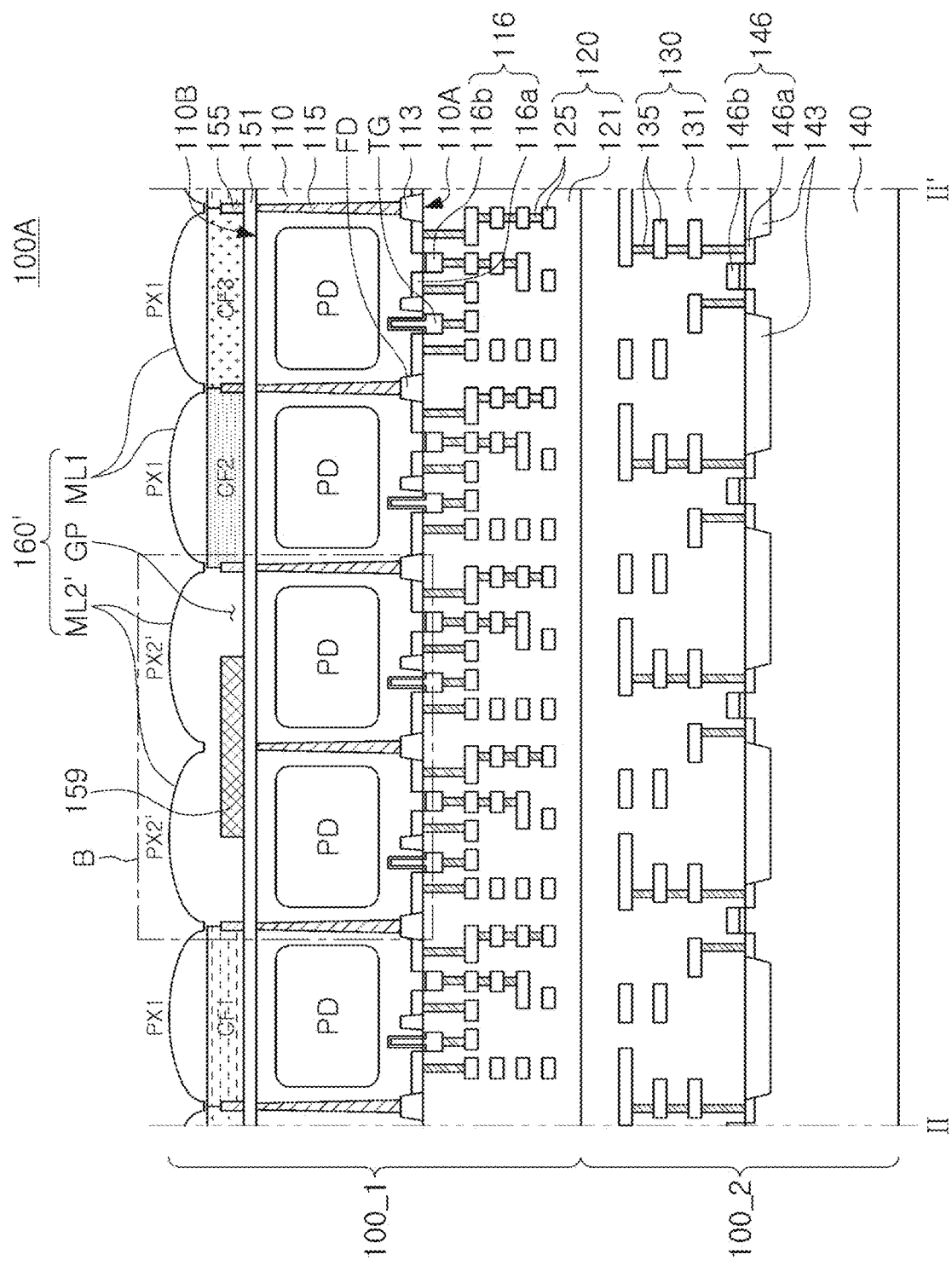
FIG. 6 is a cross-sectional view of the image sensor 100A taken along a line II-II' of FIG. 5.

FIG. 5 is a plan view of an image sensor 100A according to an embodiment of the present inventive concept, and FIG. 6 is a cross-sectional view of the image sensor 100A taken along a line II-II' of FIG. 5.

It will be understood that the image sensor 100A may be similar to the image sensor 100, and therefore a description of similar components will be omitted.

Referring to FIGS. 5 and 6, in an embodiment, the image sensor 100A may include a light blocking film 159 in each of first and second phase detection assemblies PDX1' and PDX2'. The light blocking films 159 may be disposed to block a portion of light that may be incident on photoelectric conversion devices PD of the second pixels PX2. The light blocking films 159 may be formed of a same material as the light blocking pattern 155, such as tungsten. In an embodiment, a light blocking film 159 may be disposed between two adjacent second pixels PX2 and may at least partially overlap adjacent portions of the two second pixels PX2. However, the present inventive concept is not limited thereto. For example, a phase detection region may be implemented as a pair of non-adjacent second pixels PX2, and a plurality of light blocking films 159 may be disposed in the phase detection region and may at least partially cover the non-adjacent second pixels PX2.

In an embodiment, a microlens layer 160' may be disposed on the second surface 110B. The microlens layer 160' may include a plurality of first microlenses ML1, each of which may be disposed on a first pixel PX1, and a plurality of second microlenses ML2', each of which may be disposed on a second pixel PX2. The microlens layer 160' may also include a plurality of filling portions GP, each of which may fill a second space of the light blocking pattern 155.

In an embodiment, the filling portions GP may be integrated with the microlenses ML. The filling portions GP and the microlenses ML may be formed by the same process (see FIGS. 4D and 4E). The filling portions GP may be disposed on a lower surface of the second microlenses ML2'. The filling portions GP may be formed to be continuous with the second microlenses ML2'. In other words, there might not be an interface between the filling portions GP and the second microlenses ML2'. For example, the filling portions GP may be formed of the same light-transmitting material as the microlens layer 160'.

As described above, the filling portions GP may be provided to transmit incident light that might not be transmitted by the color filters CF1, CF2, and CF3. In addition, as the filling portions GP may be continuous with the second microlenses ML2', the filling portions GP might not reflect light transmitted by the second microlenses ML2', which may greatly improve a light-receiving capability of the photoelectric conversion devices PD disposed in the second pixels PX2.

Each of the first and second phase detection assemblies PDX1' and PDX2' may receive light transmitted through microlenses ML2', may output phase signals corresponding to phase differences in the received light, and may autofocus the image sensor 100 based on the phase signals. In an embodiment, image information may be obtained by measuring a distance between an object and the image sensor. In an embodiment, each of the first and second phase detection pixel assemblies PDX1' and PDX2' may include a pair of adjacent second pixels PX2 which may be arranged in a row direction and a column direction, respectively, in a similar manner to previous embodiments. However, the inventive concept is not limited thereto. For example, as described above, each of the first and second phase detection assemblies may include a pair of nonadjacent second pixels PX2. In an embodiment, each second pixel PX2 may be a white (i.e. transparent) pixel.

Figure 7:
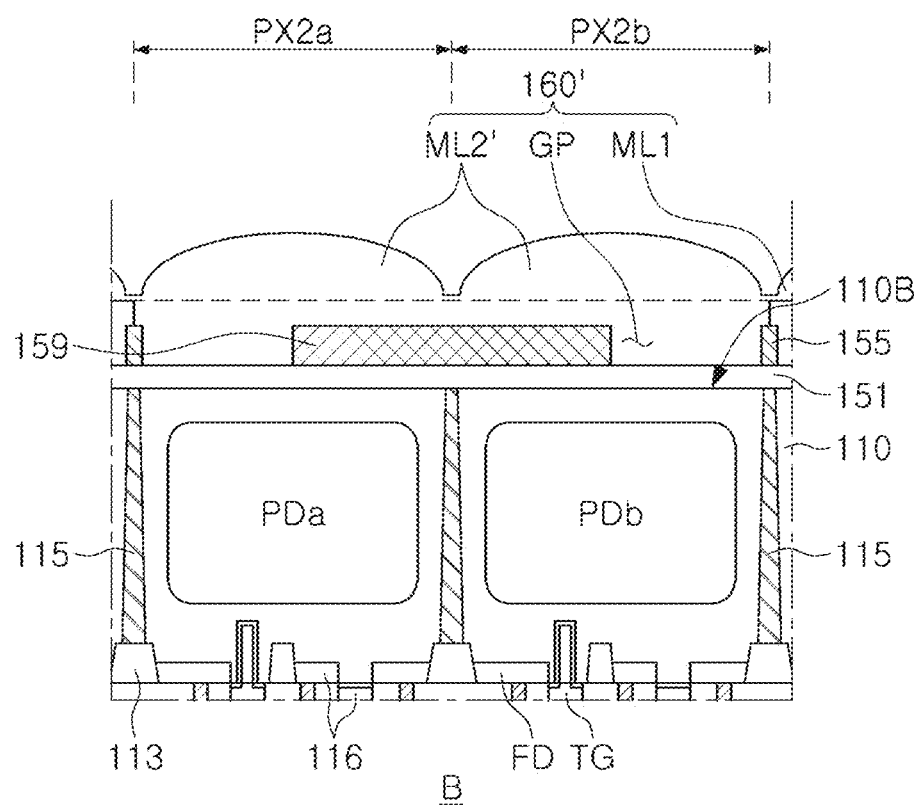
FIG. 7 is an enlarged cross-sectional view of an area B of FIG. 6.

FIG. 7. is an enlarged cross-sectional view of an area B of FIG. 6. Referring to FIG. 7, a phase detection assembly PDX' may include second pixels PX2a and PX2b, a light blocking film 159, and second microlenses ML2' respectively disposed above the second pixels PX2a and PX2b. In an embodiment, the light blocking film 159 may be disposed between the pixels PX2a and PX2b. The light blocking film 159 may at least partially block light incident on the photoelectric conversion devices PDa and PDb.

Figure 8:
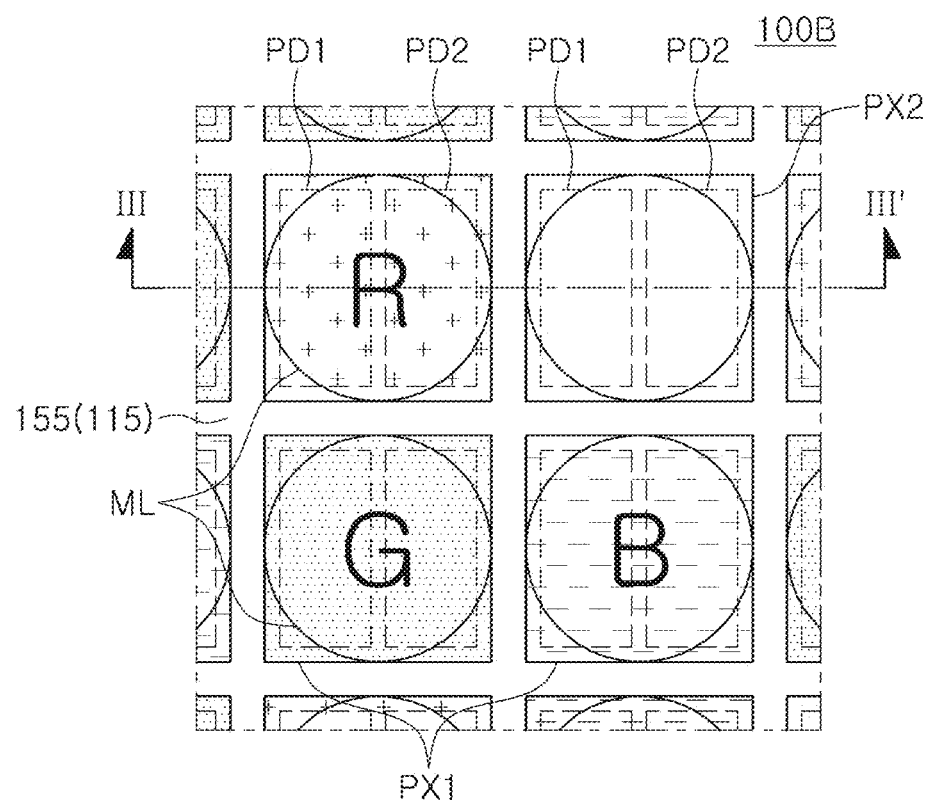
FIG. 8 is an enlarged plan view of an area of an image sensor 100B according to an embodiment of the present inventive concept.
Figure 9:
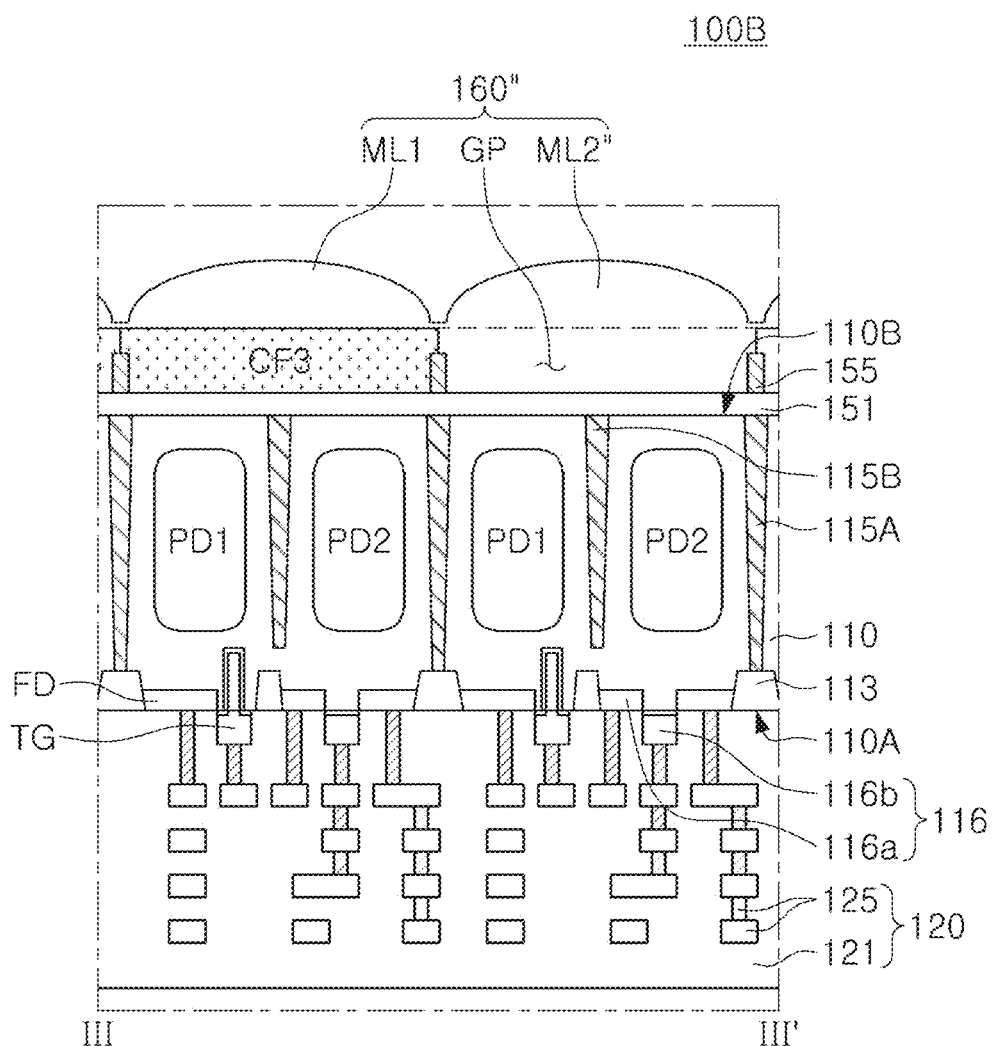
FIG. 9 is a cross-sectional view of the image sensor 100B taken along a line III-III' of FIG. 8.

FIG. 8 is an enlarged plan view of an area of an image sensor 100B according to an embodiment of the present inventive concept, and FIG. 9 is a cross-sectional view of the image sensor 100B taken along a line III-III' of FIG. 8.

It will be understood that the image sensor 100B may be similar to the image sensor 100, and therefore a description of similar components will be omitted.

Referring to FIGS. 8 and 9, the image sensor 100B may include a substrate 110, first and second photoelectric conversion devices PD1 and PD2, a first device isolation pattern 115A, a second device isolation pattern 115B, and a microlens layer 160".

The first device isolation pattern 115A may be disposed in the substrate 110. The first device isolation pattern 115A may provide the first and second pixels PX1 and PX2. For example, each of the first and second pixels PX1 and PX2 may be at least partially surrounded by the first device isolation pattern 115A. In an embodiment, the first device isolation pattern 115A may extend from a second surface 110B of the substrate 110 into a first surface 110A of the substrate 110. However, the inventive concept is not limited thereto. For example, in an embodiment, the first device isolation pattern 115A may be spaced apart from the first surface 110A. In an embodiment, the first device isolation pattern 115A may include a material such as polysilicon. In an embodiment, each first and second pixel PX1 and PX2 of the image sensor 100B may include a first and second photoelectric conversion device PD1 and PD2. The first and second photoelectric conversion devices PD1 and PD2 may be spaced apart from each other in the first direction. The first and second photoelectric conversion devices PD1 and PD2 may independently receive light incident from the second surface 110B of the first substrate 110. In an embodiment, the first substrate 110 may include P-type impurities, and the first and second photoelectric conversion devices PD1 and PD2 may include N-type impurities.

A plurality of floating diffusion regions FD and a plurality of transfer gates TG may be formed to be adjacent to the first surface 110A. In some embodiments, a floating diffusion region FD may be disposed between and connected to the first photoelectric conversion device PD1 and the second photoelectric conversion device PD2 in each of the first and second pixels PX1 and PX2. The floating diffusion regions FD may include, for example, N-type impurities.

The transfer gates TG may be disposed on the first surface 110A of the first substrate 110. A transfer gate TG may correspond to each of first and second photoelectric conversion device PD1 and PD2. The transfer gates TG may be disposed in a first insulating layer 121. In an embodiment, the transfer gates TG be disposed to be spaced apart from each other with the floating diffusion regions FD interposed therebetween.

In an embodiment, the second device isolation pattern 115B may be disposed between the first photoelectric conversion devices PD1 and the second photoelectric conversion devices PD2, intersecting each of the pixel regions PX1 and PX2. The second device isolation pattern 115B may include the same material as the first device isolation pattern 115A. The second device isolation pattern 115B may extend from the second surface 110B of the first substrate 110, in a similar manner to the first device isolation pattern 115A. The second device isolation pattern 115B may extend a shorter distance than the first device isolation pattern 115A.

According to an embodiment, a pair of first and second photoelectric conversion devices PD1 and PD2 in a second pixel PX2 may receive separate incident light from each other, and the pixel PX2 may accordingly recognize a phase difference between the received separate incident light. The pixel PX2 may autofocus the image sensor 100B based on this phase difference.

While the inventive concept has been illustrated and described with reference to embodiments thereof, it will be understood by one of ordinary skill in the art that variations in form and detail may be made therein without departing from the spirit and scope of the inventive concept as defined by the following claims.

What is claimed is:

1. An image sensor comprising:
   a first pixel comprising a first color filter, a first photoelectric conversion device (PD), and a first microlens on the first PD;
   a second pixel comprising a second PD and a first filling portion on the second PD;
   a third pixel comprising a third PD and a second filling portion on the third PD; and
   a fourth pixel comprising a fourth PD, a second microlens on the fourth PD, and a second color filter different from the first color filter,
   wherein the second pixel is directly adjacent to the first pixel in a first direction,
   wherein the third pixel is directly adjacent to the second pixel in the first direction,
   wherein the second pixel and the third pixel do not comprise any one of a red color filter, a blue color filter, and a green color filter,
   wherein each of the first filling portion and the second filling portion is configured to transmit light of wavelengths corresponding to blue, red, and green to the second PD and the third PD, respectively, and
   wherein the first color filter is configured to transmit light of the wavelength corresponding to blue.

2. The image sensor of claim 1, wherein the second color filter is configured to transmit light of the wavelength corresponding to red.

3. The image sensor of claim 2, wherein the first filling portion comprises a same material as the first microlens.

4. The image sensor of claim 3, further comprising:
   a fifth pixel comprising a fifth PD and a third filling portion on the fifth PD; and
   a sixth pixel comprising a sixth PD and a fourth filling portion on the sixth PD,
   wherein the sixth pixel is directly adjacent to the fifth pixel in a second direction perpendicular to the first direction, and
   wherein each of the third filling portion and the fourth filling portion is configured to transmit light of the wavelengths corresponding to blue, red, and green to the fifth PD and the sixth PD, respectively.

5. The image sensor of claim 4, further comprising:
   a third microlens on the second PD and the third PD; and
   a fourth microlens on the fifth PD and the sixth PD.

6. The image sensor of claim 5, further comprising:
   four color filters arranged in a Bayer-type pattern.

7. The image sensor of claim 6, wherein the first filling portion is connected to the second filling portion so that the first filling portion and the second filling portion form a single filling portion.

8. The image sensor of claim 7, further comprising:
   a first light blocking pattern between the first color filter and the first filling portion; and
   a second light blocking pattern between the second color filter and the second filling portion,
   wherein the first light blocking pattern comprises a metal.

9. The image sensor of claim 8, wherein the metal is tungsten, and
   wherein no portion of a light blocking pattern is between the first filling portion and the second filling portion.

10. The image sensor of claim 8, further comprising:
a device isolation pattern between the second PD and the third PD.

11. The image sensor of claim 10, wherein the first filling portion and the second filling portion comprise a transparent resin.

12. An image sensor comprising:
a first pixel comprising a first color filter, a first photoelectric conversion device (PD), and a first microlens on the first PD;
a second pixel comprising a second PD and a first filling portion on the second PD;
a third pixel comprising a third PD and a second filling portion on the third PD;
a fourth pixel comprising a fourth PD, a second microlens on the fourth PD, and a second color filter different from the first color filter;
a first light blocking pattern between the first color filter and the first filling portion;
a second light blocking pattern between the second color filter and the second filling portion;
a first light blocking film on the second PD; and
a second light blocking film on the third PD,
wherein the second pixel is directly adjacent to the first pixel in a first direction,
wherein the third pixel is directly adjacent to the second pixel in the first direction,
wherein the second pixel and the third pixel do not comprise any one of a red color filter, a blue color filter, and a green color filter,
wherein the first light blocking pattern has a first width in the first direction,
wherein the first filling portion has a second width greater than the first width in the first direction, and
wherein each of the first filling portion and the second filling portion is configured to transmit light of wavelengths corresponding to blue, red, and green to the second PD and the third PD, respectively.

13. The image sensor of claim 12, wherein the first light blocking film is disposed on a left side of the second PD in a plan view, and
wherein the second light blocking film is disposed on a right side of the third PD in the plan view.

14. The image sensor of claim 13, wherein the first filling portion and the first microlens comprise a same first material.

15. The image sensor of claim 13, further comprising:
a fifth pixel comprising a fifth PD and a third filling portion on the fifth PD; and
a sixth pixel comprising a sixth PD and a fourth filling portion on the sixth PD,
wherein the sixth pixel is directly adjacent to the fifth pixel in a second direction perpendicular to the first direction, and
wherein the fifth pixel and the sixth pixel do not comprise any one of the red color filter, the blue color filter, and the green color filter.

16. The image sensor of claim 14, wherein the first light blocking pattern and the first light blocking film comprise a same second material.

17. The image sensor of claim 16, wherein the first filling portion is disposed between the first color filter and the first light blocking film, and
wherein the second filling portion is disposed between the second color filter and the second light blocking film.

18. An image sensor comprising:
four color filters arranged in a Bayer-type pattern;
a first pixel comprising a first light blocking film, a first photoelectric conversion device (PD), a first microlens on the first PD, and a first filling portion on the first PD; and
a second pixel comprising a second light blocking film, a second PD, a second microlens on the second PD, and a second filling portion on the second PD,
wherein the first filling portion and the first microlens comprise a same first material,
wherein the second filling portion and the second microlens comprise a same second material,
wherein the first light blocking film is disposed on a left side of the first PD in a plan view, and
wherein the second light blocking film is disposed on a right side of the first PD in the plan view.

19. The image sensor of claim 18, further comprising:
a third pixel comprising a third light blocking film, a third PD, a third microlens on the third PD, and a third filling portion on the third PD;
a fourth pixel comprising a fourth light blocking film, a fourth PD, a fourth microlens on the fourth PD, and a fourth filling portion on the fourth PD,
wherein the third light blocking film is disposed on a top side of the third PD in the plan view, and
wherein the fourth light blocking film is disposed on a bottom side of the fourth PD in the plan view.

20. The image sensor of claim 19, wherein each of the first filling portion, the second filling portion, the third filling portion, and the fourth filling portion is configured to transmit light of wavelengths corresponding to blue, red, and green to the second PD and the fourth PD, respectively.

* * * * *